United States Patent [19]
Ando et al.

[11] Patent Number: 5,872,331
[45] Date of Patent: *Feb. 16, 1999

[54] ELECTRONIC COMPONENT AND METHOD OF FABRICATING SAME

[75] Inventors: Daizo Ando, Katano; Syuji Kondo, Takarazuka; Kunihiko Oishi, Hirakata, all of Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 304,782

[22] Filed: Sep. 12, 1994

[30] Foreign Application Priority Data

Sep. 13, 1993 [JP] Japan .................................. 5-227044
Sep. 13, 1993 [JP] Japan .................................. 5-227045

[51] Int. Cl.$^6$ ........................................ H05K 9/00
[52] U.S. Cl. .................... 174/35 R; 174/52.4; 174/52.3; 257/659; 257/680
[58] Field of Search ........................... 257/680, 698, 257/659, 660, 678, 688; 174/52.1, 52.4, 35 R, 52.3, 50.5, 50.51; 361/816, 818

[56] References Cited

U.S. PATENT DOCUMENTS

| | | | |
|---|---|---|---|
| 3,706,840 | 12/1972 | Moyle et al. | 174/52 |
| 4,639,631 | 1/1987 | Chason et al. | 310/344 |
| 4,922,321 | 5/1990 | Arai et al. | 375/68 |
| 5,103,290 | 4/1992 | Temple et al. | 357/74 |
| 5,166,773 | 11/1992 | Temple et al. | 257/678 |
| 5,446,314 | 8/1995 | Melnick et al. | 257/678 |
| 5,521,436 | 5/1996 | Temple | 257/698 |
| 5,545,845 | 8/1996 | Kondo | 174/52.4 |

FOREIGN PATENT DOCUMENTS

| | | |
|---|---|---|
| A0531985 | 3/1993 | European Pat. Off. . |
| A54-078692 | 6/1979 | Japan . |
| A60-170316 | 9/1985 | Japan . |
| A63-241941 | 10/1988 | Japan . |

*Primary Examiner*—Kristine L. Kincaid
*Assistant Examiner*—Hung V Ngo
*Attorney, Agent, or Firm*—McDermott, Will & Emery

[57] ABSTRACT

An improved hermetically sealed case for enclosing an electronic element, wherein the case has an upper portion and a lower portion connected together by atomic bonding. The upper portion includes through holes. Each hole forms a lead to provide a connection from the outside of the case to the element within the case. Each lead is arranged in the through hole to seal the hole hermetically and yet provide an electrical contact for the element. The sealed case prevents the electronic element from being deteriorated by hazardous gas generated by the conventional welding process used to seal such cases.

11 Claims, 10 Drawing Sheets

ELECTRONIC COMPONENT AND METHOD OF FABRICATING SAME

BACKGROUND OF THE INVENTION

This invention relates to an electronic component, especially to a structure of packaging an electronic element and a method of fabricating the same.

For some electronic elements, for example, surface acoustic wave (SAW) filters, it is necessary to package the filters in outer cases with some space between the filters and the inside of the case. Conventionally, a surface acoustic wave filter has been packaged in a case consisting of upper and lower cases welded together, keeping a small space upon or over the filter. The container for the filter was made from upper and lower cases of metal, for example kovar (well known alloy of Fe, Ni and Co) plated with gold, nickel, or the like. The cases were provided with brims. A pair of electric welding electrodes pressed the brims of the cases from both sides to flow a strong current to melt and fix them together. The heat from the welding caused small parts of the metal to be evaporated, and cover the surface of the aluminum of the SAW filter. Further, in the prior art, the substrate supporting the SAW filter was often fixed in the case by a silicon resin. This silicon resin was heated to fix the substrate in place. As a result, some of the resin evaporated and was deposited on the aluminum surface of the SAW element.

The deposits of metal and resin on the SAW filter often had adverse effects on the operating characteristics of the filter. For example, the frequency of the SAW filter was caused to shift adversely. The present invention prevents the adverse effects of these deposits on the elements housed in the package described in further detail hereinafter.

SUMMARY OF THE INVENTION

It is an object of the present invention to provide an electronic component comprising an electronic element and a case hermetically enclosing the element.

It is another object of the present invention to provide an electronic component comprising an electronic element and a case enclosing the element with some clearance between the element and the case and without deterioration of the element due to harmful gas.

It is still another object of the present invention to provide a method of fabricating an electronic component comprising an electronic element and a case hermetically enclosing the element.

In order to attain the above objects, the electronic component according to the present invention comprises an electronic element, case, and a lead, the electronic element having input/output electrodes, the case comprising an upper and lower case to be connected together to enclose the electronic element therein, the upper case having a through hole, and the lead being arranged in the through hole to fill or seal the hole hermetically.

The electronic component according to the present invention further comprises the upper and lower cases of glass connected by atomic bonding.

The electronic component is fabricated, according to the present invention, by a method comprising the steps of enclosing an electronic element having electrodes in a case with through holes, and providing the holes of said electronic component with leads for the electrodes.

The method further comprises the steps of preparing a pair of upper and lower cases of glass having edges to be connected or coupled together to surround an electronic element or elements and coupling the pair of cases by an atomic bonding method, thereby enclosing the electronic element or elements in a hermetically sealed case.

As pointed out in greater detail below of this invention provides important advantages. For example, deterioration of the element is prevented since the element is enclosed in a case hermetically sealed by atomic bonding. Also, the case includes leads for connecting terminals on the outside of the case with electrodes on said element, said leads being formed from balls placed and deformed in the through holes in the case to hermetically seal the case.

Another advantage is provided by the elimination of welding to form the cases of the component.

The invention itself, together with further objects and attendant advantages, will best be understood by reference to the following detailed description taken in conjunction with the accompanying drawings.

DETAILED DESCRIPTION OF EMBODIMENTS

Figure 1:
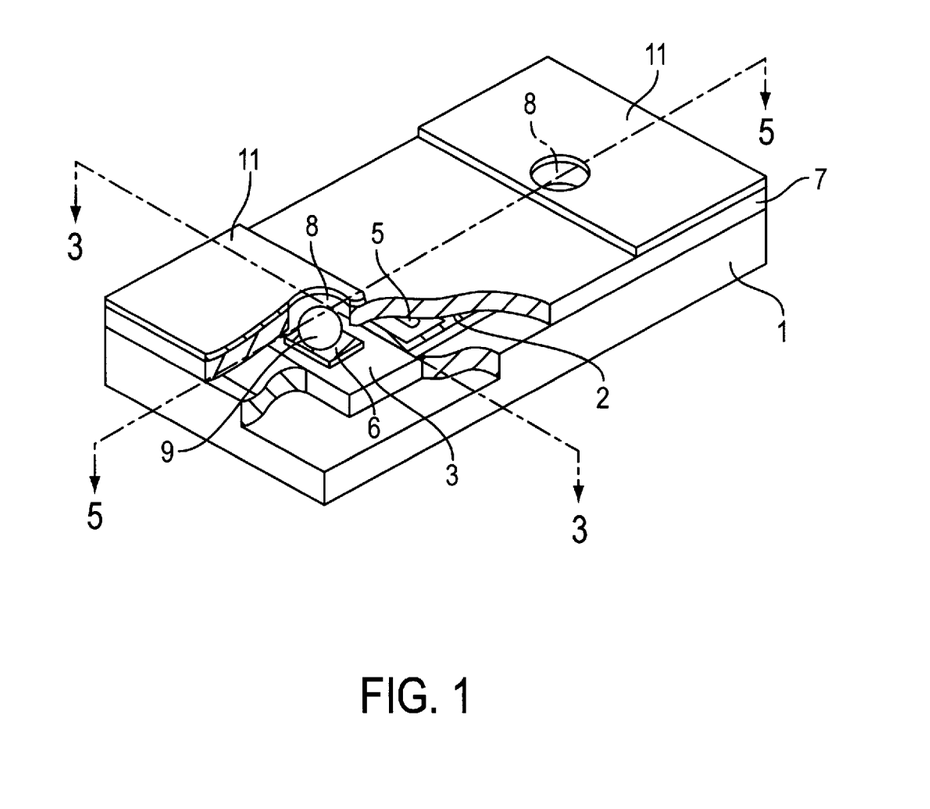
FIG. 1 is a partial fragmental perspective view of an example of an electronic component according to the present invention.
Figure 2:
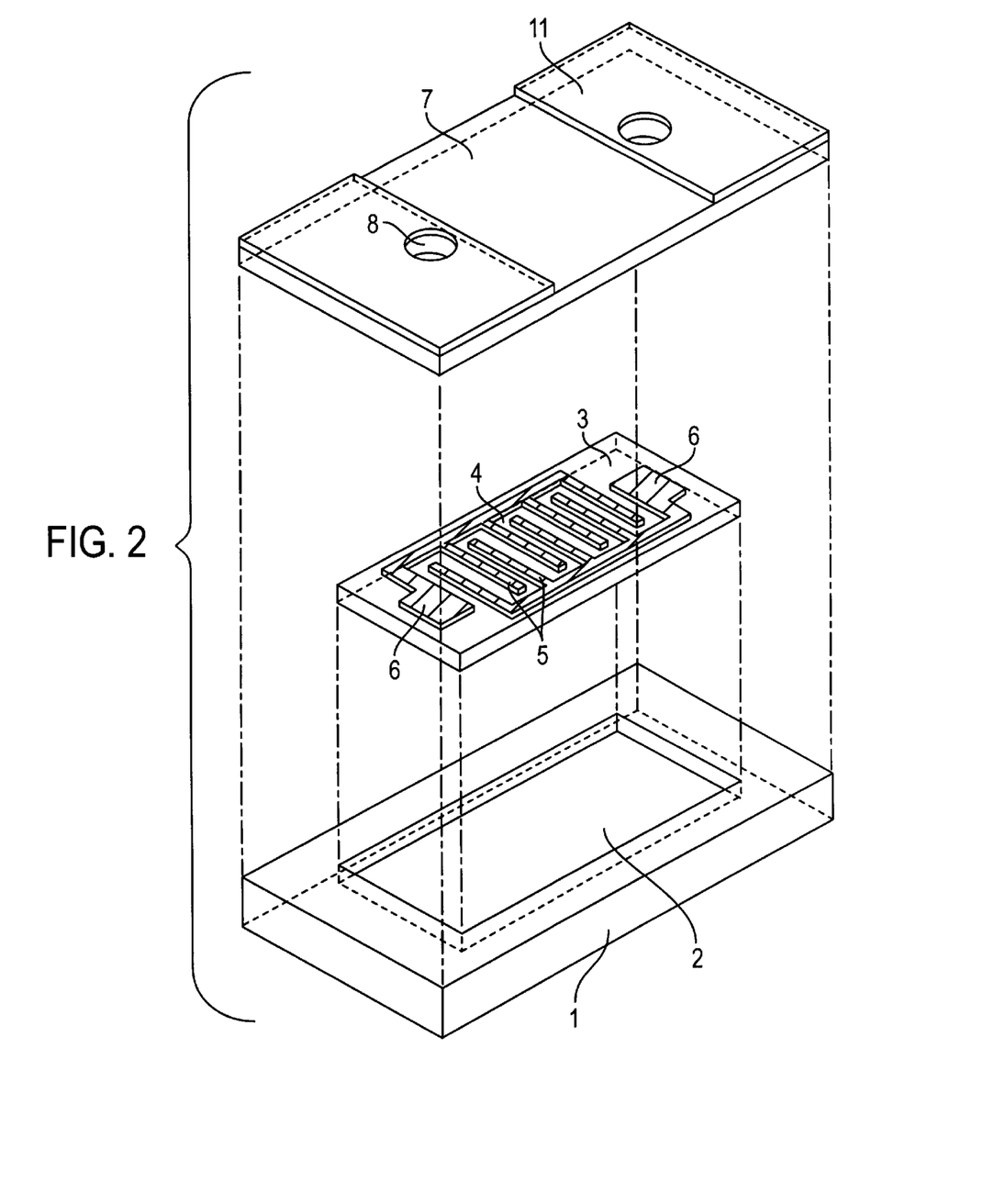
FIG. 2 is a general exploded view of an example of an electronic component of the present invention.

Referring to FIG. 1 and FIG. 2, an electronic component according to the present invention comprises an electronic element 3, for example, a surface acoustic wave filter, and a case consisting of a lower case 1 and an upper case 7. The electronic element 3, typically a surface acoustic wave (SAW) filter, is composed of a 380 µm thick rectangular substrate 4 consisting of quartz, lithium tantalate or lithium niobate, for example. The substrate is provided with a comb electrode 5 of 1 µm thick aluminum with input/output electrodes 6 at either ends.

The electronic element 3 is packaged in a case of soda glass comprising a lower case 1 and an upper case 7. The lower case 1 is a plate having a hollow of 400 µm depth to receive and fix the element 3 therein. The upper case 7 is a plate of 300 µm thickness with each through hole 8 of 0.22 mm diameter for the lead. The underside edge or surface of the upper case 7 and the edge or surface of the lower case 1 are atomically bonded together to enclosed the element hermetically. A space or hollow 2 is provided between the inner surface of the upper case 7 and the substrate 4. Also, the substrate is spaced from the vertical walls of the hollow 2 of the lower case 1.

In order to hermetical seal the upper and lower cases 1 and 7, both the cases are prepared by making said edges or surfaces extremely flat in terms of 10 nm/20 mm. Specifically, the surfaces should be equal to or flatter than 10 mm/20 mm. The edges or surfaces are treated with a surface-active agent, e.g., MA02 type marketed by Kanto Chemical Co., Tokyo under the trademark "Extran" and then washed with distilled water, to have an OH radical appearing on the surface. Then, the upper and lower cases are coupled together with the SAW filter inside, and are kept in an inert gas (nitrogen for example) of 300° C. for 5 minutes to seal the cases hermetically. The cases may be formed from any glass other than soda glass, e.g., borosilicate glass. The surface active agent is to be neutral. The surface active agent should not be alkaline.

Figure 3:
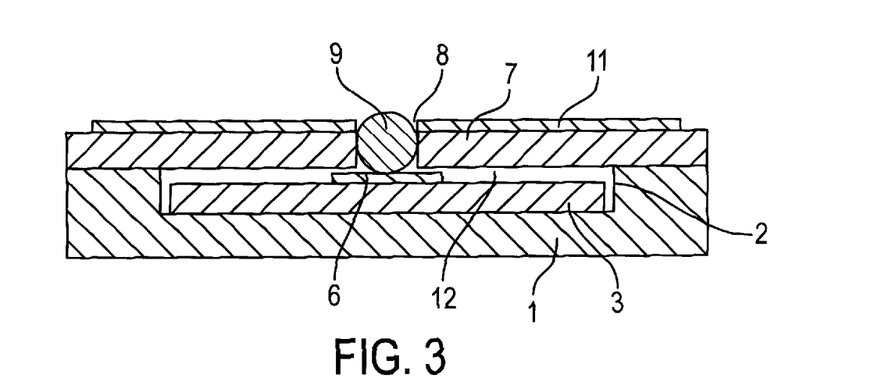
FIG. 3 is a sectional view of the electronic component of FIG. 1 cut along the 3—3 line passing through one electrode of the element showing a step used in fabricating the lead for the component.
Figure 4:
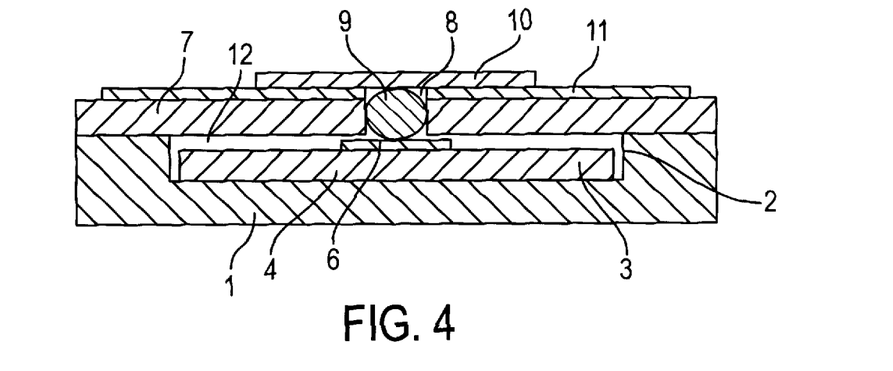
FIG. 4 is a sectional view passing through one electrode of the electronic component of the present invention showing a further step used in fabricating the component wherein a conductor is shown pushing down on a lead.

As shown in FIG. 3, the upper case is provided with a lead consisting of a first conductor 9 in the form of a lump, preferably a ball of Sn of 0.20 mm diameter. In FIG. 4, a second conductor 10 of Sn plate is shown, which is welded hermetically to the outer electrode 11 to push the first conductor 9 onto the electrode 6 of the electronic element.

The first conductor 9, when pushed by the second conductor 10 is expanded in the direction perpendicular to the pushing direction to fill the small gap between the conductor 10 and the inside wall of the hole 8 to seal the hole hermetically.

The first conductor 9, in the form of a ball, and the second conductor may, instead of Sn, can be of Au, Cu, or any alloy of them. As a variation, the first conductor may be a ball of an elastic body covered with such conducting material or paint.

Figure 5:
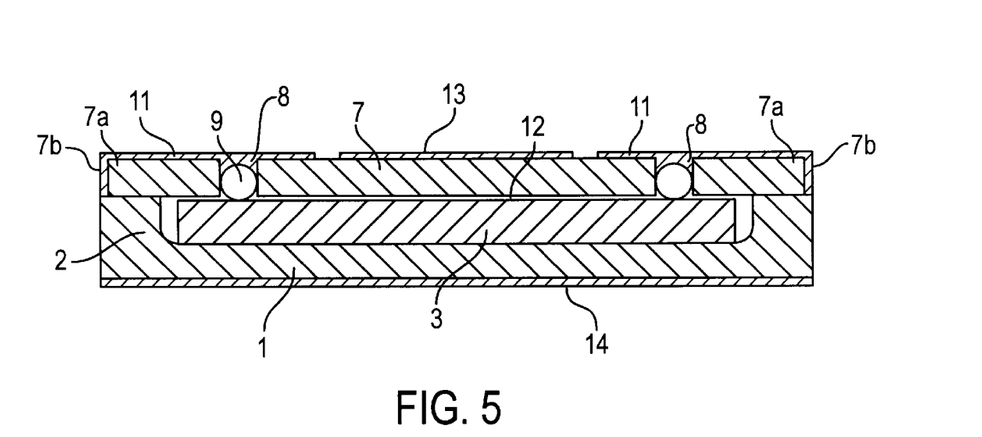
FIG. 5 is a sectional view of another example of an electronic component of the present invention, along the plane similar to the 5—5 line of FIG. 1 passing through two electrodes of the element.

Referring to FIG. 5, the outer electrode 11 may be a silver film printed on the upper case 7 using a polymer silver conducting composition consisting of phenol resin and silver powder e.g., '1107-S' of Electroscience Laboratory, USA, which flows into the through hole 8 to fill the hole and contact the first conductor 9. The outer electrode 11 is elongated or extended to the side surfaces 7a of the upper case. The side surfaces are provided with a notch 7b that is filled by the second conductor. This elongated part or portion of the conductor 11 is often useful when the component is mounted on an electronic set.

Figure 6:
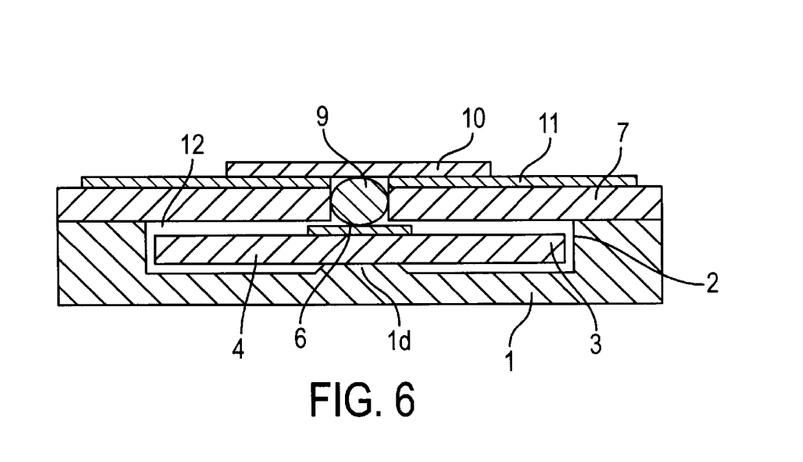
FIG. 6 is a sectional view passing through an electrode of another example of an electronic component of the present invention wherein the enclosed element is spaced from the lower case.

Referring to FIG. 6, the hollow portion of the lower case 1 is provided therein with a small projection 1d to support the electronic element 3 just under the through hole. With such a projection, the substrate 4 can be supported by two projections. It should be apparent that an element with two electrodes 6 is supported not only by two projections from the underside of the substrate 4, but also is supported by the two leads 9 connected to the two electrodes from the upper side to firmly hold the element 3 in place. Moreover, as a variation, any number of small projections can be used to support a substrate. As a result, heat conduction to the element from outside heat is decreased thereby, reducing the degradation of element, since the area of the contact to transmit heat is reduced.

Figure 7:
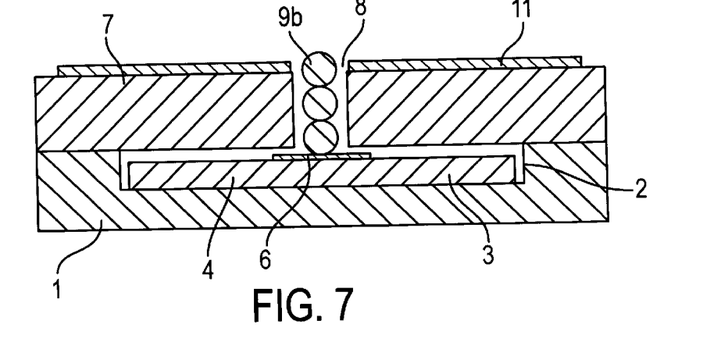
FIG. 7 is a sectional view passing through an electrode of another example of an electronic component of the present invention wherein the lead comprises three balls.
Figure 8:
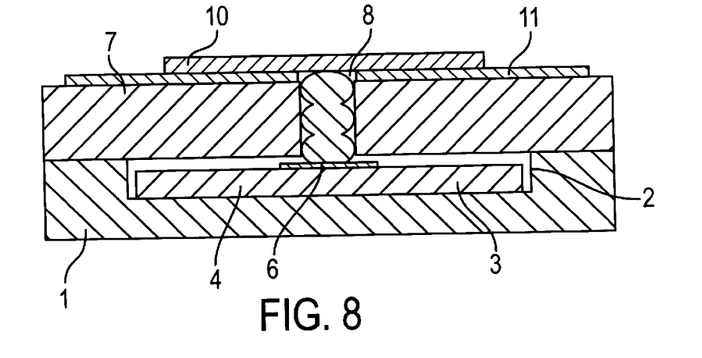
FIG. 8 is a sectional view passing through an electrode of the example of FIG. 7 wherein another conductor is shown pushing down on the balls.

Referring to FIG. 7 the first conductor is illustrated as comprising three balls 9a arranged vertically in a hole 8. In FIG. 8, the three balls are shown being pushed down by a second conductor 10 to fill the small gap between the conductor 10 and the inside surface of the hole 8 to seal the hole hermetically.

Figure 9:
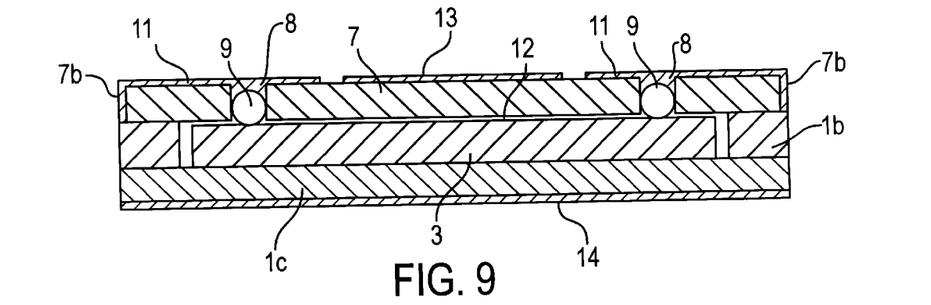
FIG. 9 is a sectional view passing through both electrodes of another example of an electronic component of the present invention wherein the lower case comprises two parts.

Further, the hollow for the lower case 1 may be made, as shown in FIG. 9, from a plate 1b and a frame 1c bonded atomically together.

Electrical shielding is provided for the electronic component as shown in FIG. 5 and FIG. 9. In both these figures, the upper case 7 is provided with an electric conductor film 13 on the upper surface thereof between the outer electrodes 11 but separated therefrom. The film 13 is formed when the outer electrodes are formed and can be used as an electric shield. Another electric conductor film 14 can be provided on the under surface of the lower case 1 to make the electrical shielding more effective.

Figure 10:
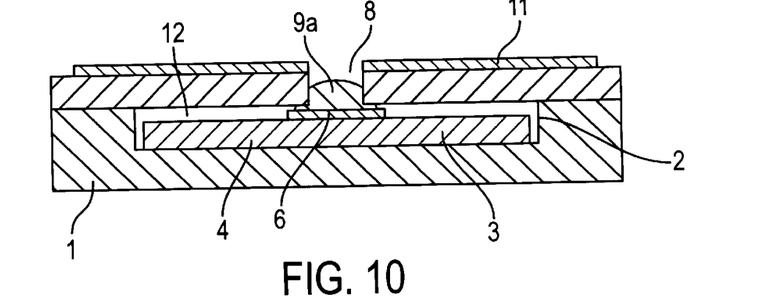
FIG. 10 is a sectional view passing through an electrode of another example of an electronic component of the present invention showing a step in fabricating the lead.
Figure 11:
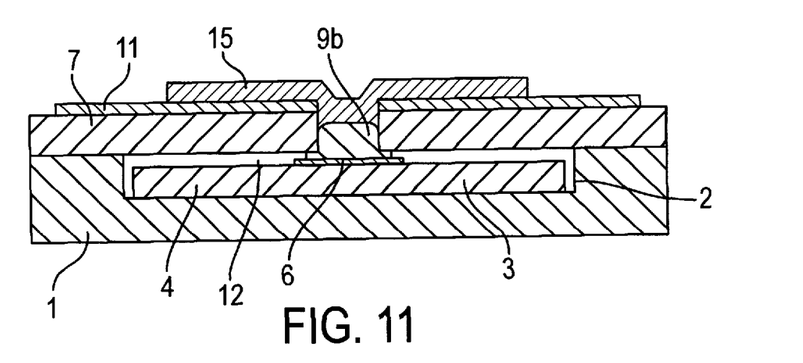
FIG. 11 is a sectional view passing through an electrode of another example of FIG. 10 showing a further step in fabricating the lead.

FIG. 10 and FIG. 11 show another example of fabricating the lead for the electronic component of the present invention. In FIG. 10, a lump or ball 9a of metal to be deformed is inserted into the through hole 8, and then the hole 8 is filled with said metal by pressing, heating or by applying ultrasonic energy. Further in FIG. 11, an electric conducting paste is provided to form a conducting film 15 to connect the ball 9a with the outer electrode 11.

Figure 12:
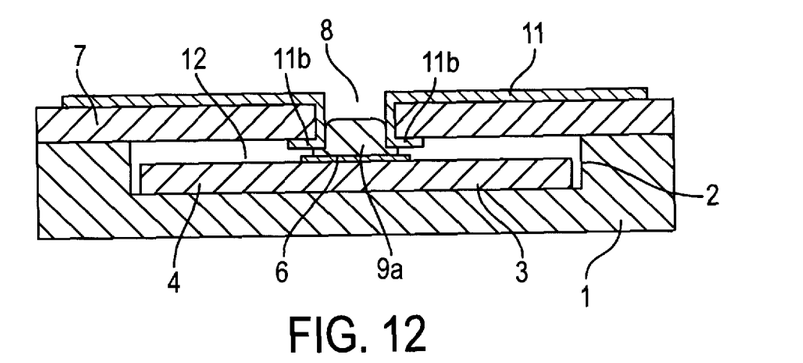
FIG. 12 is a sectional view passing through an electrode of another example of an electronic component of the present invention wherein the outer electrode extends into the case.

FIG. 12 shows another example of the electronic component of the present invention wherein the outer electrode 11 has a part 11a elongated into the through hole 8 in the form of a small hem along the under surface of the upper case. The elongated part or hem 11a works as a second conductor to connect the electrode 6 to the outside of the case. Moreover, extending the electrode 11 through the hole and into the inside of the case provides a more efficient seal.

Figure 13:
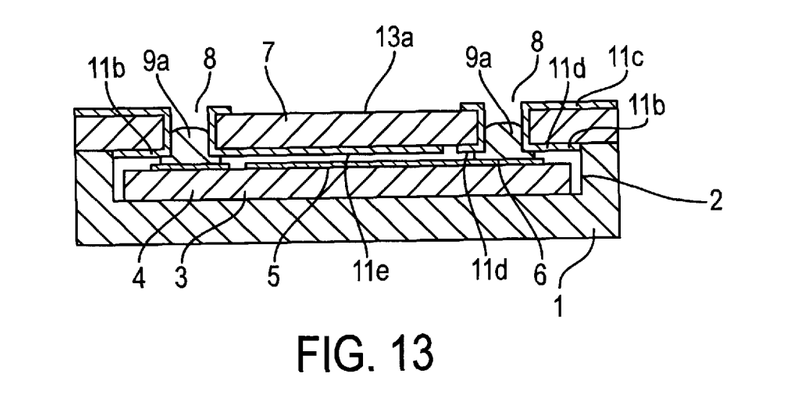
FIG. 13 is a sectional view passing through both electrodes of still another example of an electronic component of the present invention wherein shielding is provided for the component.
Figure 14:
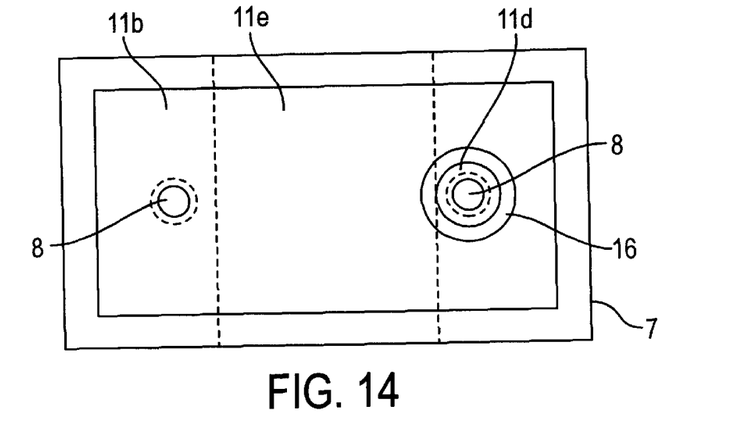
FIG. 14 is a bottom view of the upper case of the electronic component shown in FIG. 13.

FIGS. 13–16 show further examples of electrical shielding for the electrical component of this invention. In FIG. 13 and FIG. 14, the outer electrode 11a is elongated through the through hole 8, to the back side of the upper case 7 as electrode 11b to form a shield layer 11e. The other outer electrode 11c is extended through the through hole 8 to form a small hem 11d on the back side of the upper case 7. A gap 16 separates the portion 11b of electrode 11a from the portion 11d of electrode 11c. Also, a large gap 13a separates 11a from 11c. The shielded layer 11e shields the SAW filter element 5 from the outside. As shown in FIG. 5 and FIG. 9a, a shield layer may be placed also on the under surface of the lower case 1, if necessary.

Figure 15:
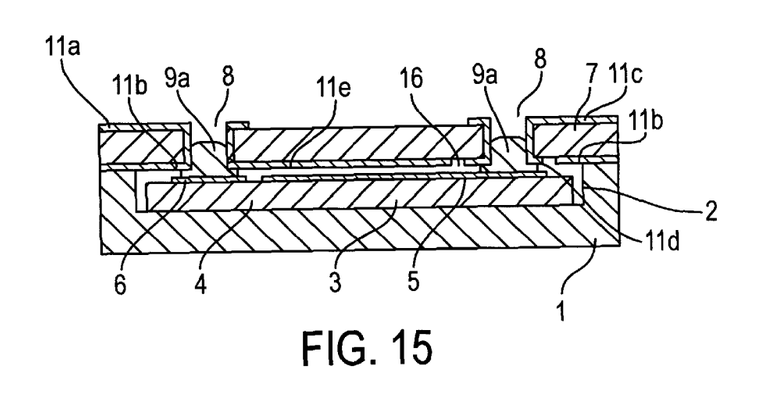
FIG. 15 is a sectional view passing through both electrodes of still another example of an electronic component of the present invention wherein shielding is provided for the component.
Figure 16:
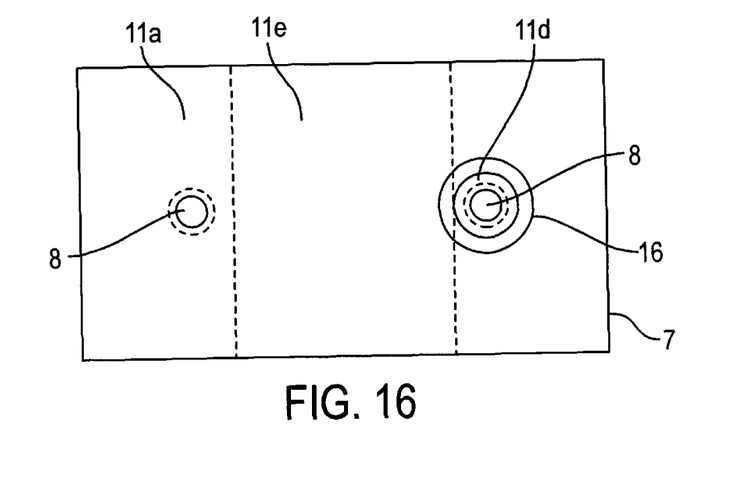
FIG. 16 is a bottom view of the upper case of the electronic component shown in FIG. 15.

Referring to FIG. 15 and FIG. 16, the shield layer 11e is similar to that shown in FIG. 13 and FIG. 14, except that the underside portion 11b extends to the outer edge of the upper case 7. With this arrangement, upper case anode bonding is possible, with the layer 11e connected as a anode and the lower case as a cathode. A thin layer of aluminum is preferable as the material for the elongated part 11b.

Figure 17:
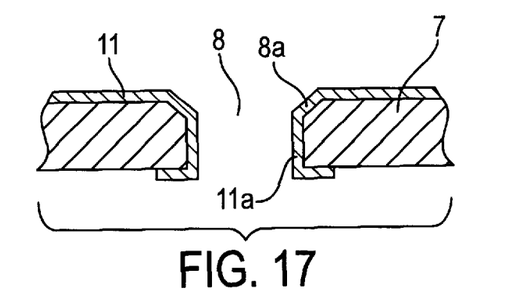
FIG. 17, FIG. 18, and FIG. 19 are partially cut away views of examples of fabricating the lead for the electronic components of the present invention.
Figure 18:
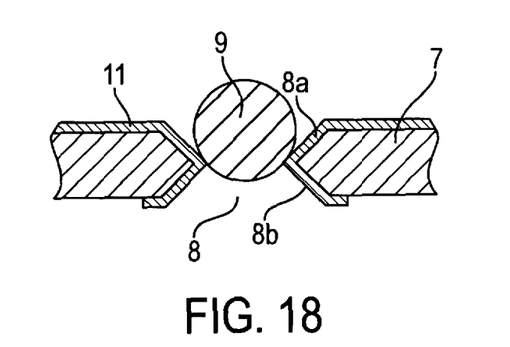
Figure 19:
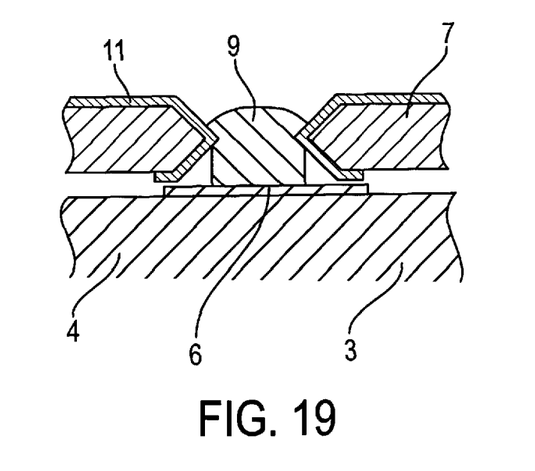

FIG. 17, FIG. 18 and FIG. 19 show a preferable process of fabricating the lead 9. Referring to FIG. 17, the through hole 8 is preferably expanded at its upper entrance 8a. Referring to FIG. 18 and FIG. 19, the through hole 8 may be expanded not only on the upper side 8a but also on the under side 8b. Also, the ball 9 may have a larger diameter than the inside diameter of the through hole, whereby the hole 8 may be filled easier.

Figure 20:
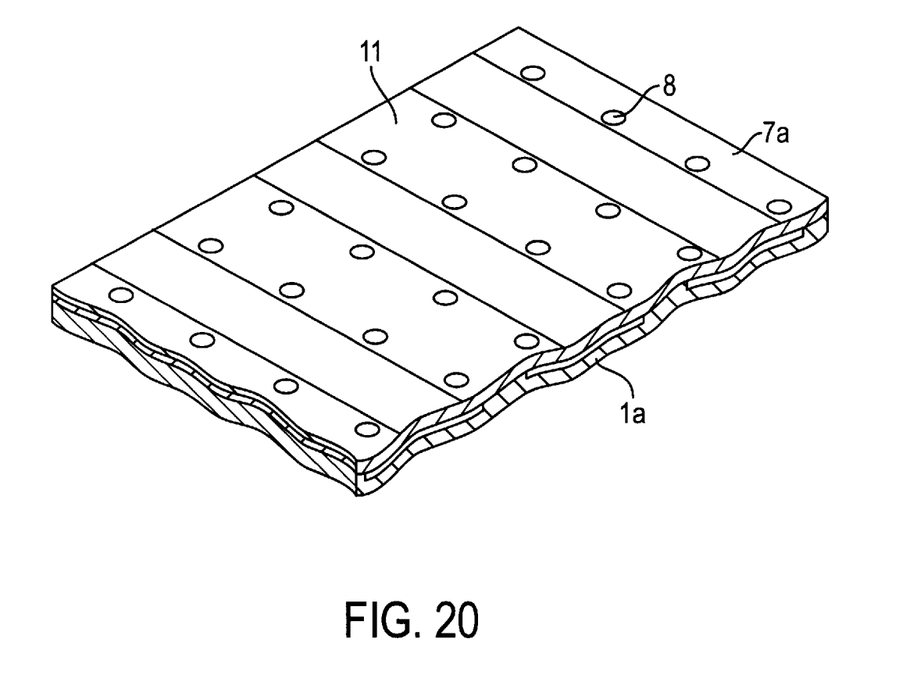
FIG. 20 is a partially broken perspective view of an example of a electronic component fabricated to enclose a plurality of elements.
Figure 21:
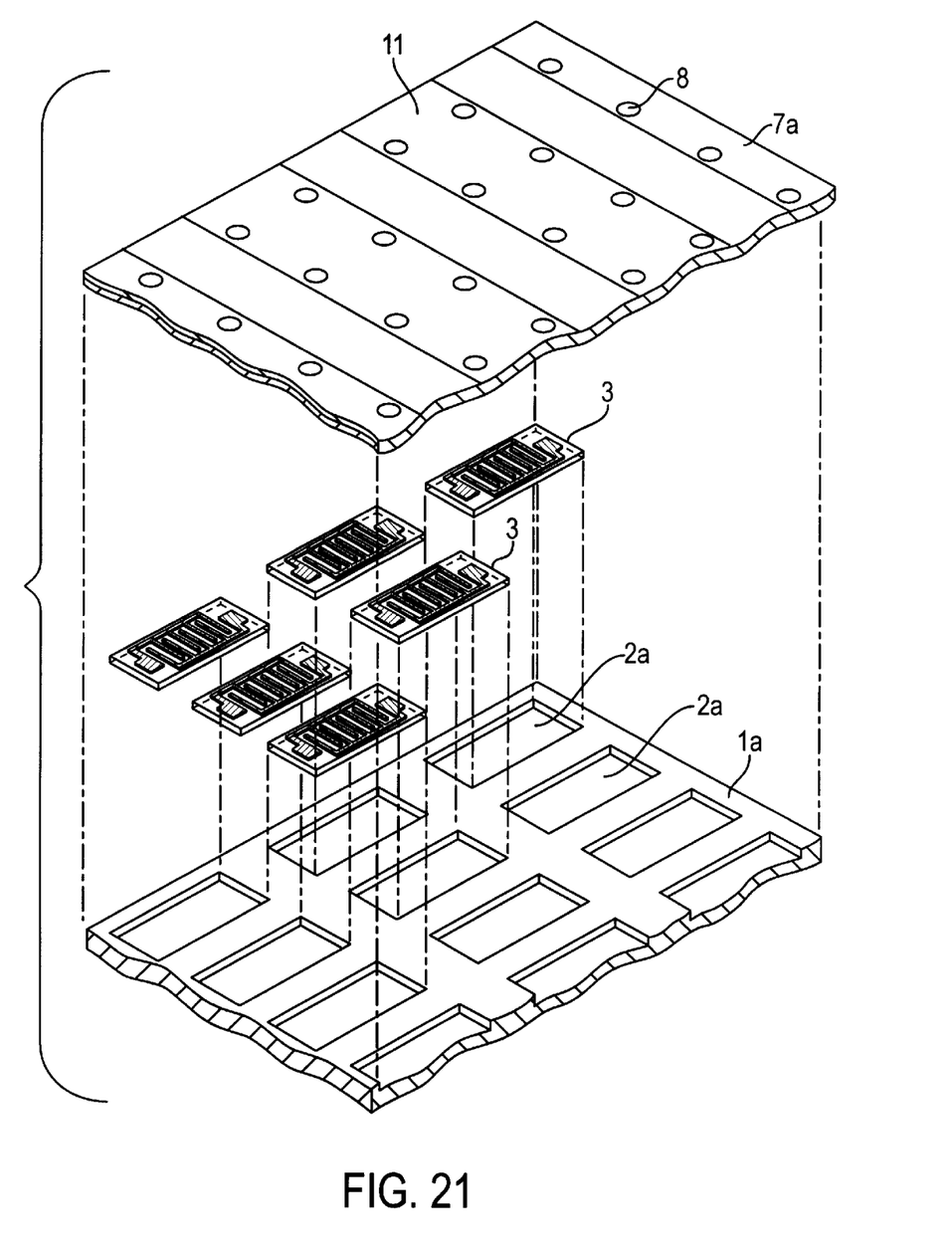
FIG. 21 is an exploded view of the electronic component shown in FIG. 20.

Referring to FIG. 20 and FIG. 21, there is shown an example of an application of the present invention. For example, the electronic component may include many elements. A lower case 1a is provided with many hollows 2a arranged vertically and horizontally. SAW filter elements 3 are put in the hollows and an upper case 7a is positioned to cover the element. The cases may be sealed by atomic bonding, or anode bonding. Then, the balls 9 are put in the through holes and pressed by second conductors 10 to seal the holes and provides the electric connections from the inside to the outside of the component. Thus, many SAW filters are fabricated and by cutting, many discrete SAW filters can be obtained.

Instead of enclosing the SAW filters in the case, other electronic elements such as a semiconductor or other integrated circuits may be enclosed as occasion demanded. Moreover, the shape of the hollows inside the case may take the shape of the substrate to be enclosed within the case.

The embodiments described above provide a number of significant advantages. For example, the use of material, such as glass that can be bonded to enclose electrical elements provides the advantage of preventing the elements from deterioration due to the deposits of gas generated by welding a conventional case to seal electrical elements inside the case.

As yet another advantage, the connections from the outside of the electronic component package to the electrical elements enclosed therein are made according to the invention in a manner that hermetically seals the holes in the package used to form the connection between the outside and inside of the package. In particular, the use of metal leads in the form of balls act to fill and seal the holes, preventing further deterioration.

Also, another advantage is provided by the present invention by the inclusion of various ways to shield the electronic package.

Of course, it should be understood that a wise range of changes and modifications can be made to the preferred embodiment described above. It is therefore intended that the foregoing detailed description be understood that it is the following claims, including all equivalents, which are intended to define the scope of this invention.

What is claimed is:

1. An electronic component comprising:
   an electronic element,
   a case, and
   at least one lead,
   wherein the electronic element has at least one electrode,
   wherein said case comprises an upper case having a top surface and a bottom surface and a lower case having a top surface and a bottom surface,
   wherein the upper case has a through hole for said at least one electrode,
   wherein said lead is arranged in the through hole entirely below said top surface of said upper case to hermetically fill the hole and to provide an electrical connection to the top surface of the upper case,
   wherein the upper case and the lower case are made of glass,
   wherein the bottom surface of the upper case and the top surface of the lower case are flat, and
   wherein the bottom surface of the upper case and the top surface of the lower case are connected directly together by atomic bonding to enclose the electronic element therein.

2. An electronic component according to claim 1, wherein said at least one electrode extends to the bottom surface of the upper case.

3. An electronic component according to claim 1, further comprising,
   at least one outer electrode on said upper case,
   wherein a portion of said at least one outer electrode provides an electrical shield for said electronic element.

4. An electronic component according to claim 1, further comprising,
   at least one outer electrode on said upper case,
   wherein a portion of said at least one outer electrode extends to an outer edge of said upper case.

5. An electronic component according to claim 1, wherein the bottom surface of the upper case and the top surface of the lower case are flat in terms of 10 nm to 20 nm.

6. An electronic component according to claim 1, wherein the bottom surface of the upper case and the top surface of the lower case are cleaned and heated to atomically bond the upper and lower cases.

7. An electronic component according to claim 6, wherein the bottom surface of the upper case ad the top surface of the lower case are treated with a surface-active agent, washed and heated to around 300° C.

8. An electronic component comprising:
   an electronic element having a plurality of electrodes,
   a case having an upper case having a top surface and a bottom surface and a lower case having a top surface and a bottom surface, wherein the bottom surface of the upper case and the top surface of the lower case are connected directly together by atomic bonding to enclose the electronic element therein,
   wherein the upper case has a hole extending therethrough from the top surface to the bottom surface of said upper case for each of said electrodes of said electronic element, wherein said hole is lined with a continuous conductor that also covers at least a portion of said top surface and said bottom surface of said upper case, and a lead positioned within said hole entirely below said top surface of said upper case in contact with one of said electrodes of said electronic element and hermetically sealing said hole.

9. An electronic component according to claim 8, further comprising, a further plurality of electrodes, wherein one of said further plurality of electrodes covers said hole and makes contact with the conductor that lines said hole.

10. An electronic component according to claim 8, wherein a portion of the conductor provides an electrical shield for said electronic element.

11. An electronic component according to claim 8, wherein a portion of said conductor lining said hole extends to an outer edge of said upper case.

* * * * *

UNITED STATES PATENT AND TRADEMARK OFFICE
CERTIFICATE OF CORRECTION

PATENT NO. : 5,872,331
DATED : February 16, 1999
INVENTOR(S) : Ando, et. al.

It is certified that error appears in the above-identified patent and that said Letters Patent is hereby corrected as shown below:

Claim 7, line 2, change "ad" to --and--.

Signed and Sealed this

Third Day of October, 2000

Attest:

Attesting Officer

Q. TODD DICKINSON

Director of Patents and Trademarks